US012590363B2

(12) United States Patent
AuBuchon et al.

(10) Patent No.: US 12,590,363 B2
(45) Date of Patent: Mar. 31, 2026

(54) APPARATUS FOR SINGLE CHAMBER DEPOSITION AND ETCH

(71) Applicant: Applied Materials, Inc., Santa Clara, CA (US)

(72) Inventors: Joseph AuBuchon, San Jose, CA (US); Philip A. Kraus, San Jose, CA (US); Thai Cheng Chua, Cupertino, CA (US); James Carducci, Sunnyvale, CA (US); Hanhong Chen, Milpitas, CA (US); Zhejun Zhang, Santa Clara, CA (US); Hao Zhang, Newark, CA (US); Xiankai Yu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 791 days.

(21) Appl. No.: 17/825,229

(22) Filed: May 26, 2022

(65) Prior Publication Data

US 2022/0389571 A1      Dec. 8, 2022

Related U.S. Application Data

(60) Provisional application No. 63/230,030, filed on Aug. 5, 2021, provisional application No. 63/208,490, filed on Jun. 8, 2021.

(51) Int. Cl.
| | |
|---|---|
| *C23C 16/34* | (2006.01) |
| *C23C 16/04* | (2006.01) |

(Continued)

(52) U.S. Cl.
CPC .......... *C23C 16/345* (2013.01); *C23C 16/045* (2013.01); *C23C 16/45536* (2013.01); *C23C 16/45553* (2013.01); *H01J 37/32201* (2013.01); *H10P 14/6336* (2026.01); *H10P 14/6339* (2026.01); *H10P 50/242* (2026.01);

(Continued)

(58) Field of Classification Search
CPC ................ C23C 16/345; C23C 16/045; C23C 16/45536; C23C 16/45553; C23C 16/34; C23C 16/45542; C23C 16/511; C23C 16/56; H01J 37/32201; H01J 2237/3321; H01J 2237/334; H01L 21/02274; H01L 21/0228; H01L 21/3065; H01L 21/31116; H01L 21/28562; H01L 21/0217; H01L 21/67167; H01L 21/6719; H01L 21/67742;

(Continued)

(56) References Cited

U.S. PATENT DOCUMENTS

| | | | | |
|---|---|---|---|---|
| 5,863,376 A | * | 1/1999 | Wicker | ............. C23C 16/45565 |
| | | | | 156/345.44 |
| 5,935,340 A | * | 8/1999 | Xia | ...................... C23C 16/4405 |
| | | | | 134/1.1 |

(Continued)

FOREIGN PATENT DOCUMENTS

| | | | | |
|---|---|---|---|---|
| CN | 104241383 A | * | 12/2014 | ......... H10D 30/0297 |

*Primary Examiner* — Maliheh Malek
(74) *Attorney, Agent, or Firm* — SERVILLA WHITNEY LLC

(57) ABSTRACT

Methods for filling a substrate feature with a seamless dielectric gap fill are described. Methods comprise sequentially depositing a film with a seam and partially etching the film in the same processing chamber. Methods and apparatus allow for the same hardware to be used for PEALD deposition of a film as well as plasma etch of the film.

15 Claims, 9 Drawing Sheets

700

(51) Int. Cl.

| | |
|---|---|
| *C23C 16/455* | (2006.01) |
| *H01J 37/32* | (2006.01) |
| *H01L 21/02* | (2006.01) |
| *H01L 21/3065* | (2006.01) |
| *H01L 21/311* | (2006.01) |
| *H10P 14/60* | (2026.01) |
| *H10P 50/24* | (2026.01) |
| *H10P 50/28* | (2026.01) |

(52) U.S. Cl.
CPC .... *H10P 50/283* (2026.01); *H01J 2237/3321* (2013.01); *H01J 2237/334* (2013.01)

(58) Field of Classification Search
CPC ......... H01L 21/68764; H01L 21/68771; H01L 21/76877
See application file for complete search history.

(56) References Cited

U.S. PATENT DOCUMENTS

| | | | | |
|---|---|---|---|---|
| 5,939,831 A * | 8/1999 | Fong | ................. | H01L 21/67017 |
| | | | | 134/1.1 |
| 5,963,840 A * | 10/1999 | Xia | ................... | H01L 21/02315 |
| | | | | 438/743 |
| 5,968,587 A * | 10/1999 | Frankel | ............ | H01L 21/67103 |
| | | | | 219/390 |
| 5,994,209 A * | 11/1999 | Yieh | ................... | C23C 16/4405 |
| | | | | 438/541 |
| 6,019,848 A * | 2/2000 | Frankel | ................ | C23C 16/455 |
| | | | | 118/715 |
| 6,030,881 A * | 2/2000 | Papasouliotis | ........ | C23C 16/045 |
| | | | | 257/E21.546 |
| 6,114,216 A * | 9/2000 | Yieh | ................. | C23C 16/45561 |
| | | | | 257/E21.279 |
| 6,329,297 B1 * | 12/2001 | Balish | ................. | H01J 37/3244 |
| | | | | 156/345.35 |
| 6,347,636 B1 * | 2/2002 | Xia | ................... | H01L 21/67017 |
| | | | | 134/1.1 |
| 6,514,471 B1 * | 2/2003 | Hsiung | ................ | B01D 53/685 |
| | | | | 423/240 S |
| 6,592,817 B1 * | 7/2003 | Tsai | ................... | H01J 37/32935 |
| | | | | 422/62 |
| 7,229,593 B1 * | 6/2007 | Ho | .......................... | G01N 13/00 |
| | | | | 73/1.01 |
| 8,435,894 B2 * | 5/2013 | Chandrashekar | ..... | H01L 21/486 |
| | | | | 257/E21.586 |
| 9,837,312 B1 * | 12/2017 | Tan | ...................... | C23C 18/1628 |
| 9,966,232 B2 * | 5/2018 | Tadigadapa | ......... | B81C 99/0025 |
| 9,997,405 B2 * | 6/2018 | Chandrashekar | ....... | C23C 16/00 |
| 10,192,775 B2 * | 1/2019 | Manna | ................. | H10D 62/115 |
| 2007/0227668 A1 * | 10/2007 | Iizuka | ................ | H01J 37/3244 |
| | | | | 156/345.48 |
| 2008/0217775 A1 * | 9/2008 | Pai | .................... | H01L 21/76877 |
| | | | | 257/E23.141 |
| 2008/0311711 A1 * | 12/2008 | Hampp | ............. | H01L 21/76846 |
| | | | | 257/E21.409 |
| 2009/0075454 A1 * | 3/2009 | Ang | ................... | H01L 21/76224 |
| | | | | 257/E21.546 |
| 2011/0159690 A1 * | 6/2011 | Chandrashekar | ........................... |
| | | | | H01L 21/28556 |
| | | | | 438/675 |
| 2012/0064684 A1 * | 3/2012 | Hsieh | ................ | H10D 30/0295 |
| | | | | 438/270 |
| 2014/0154887 A1 * | 6/2014 | Trivedi | .............. | H01L 21/3088 |
| | | | | 156/345.31 |
| 2017/0271196 A1 * | 9/2017 | Manna | ............ | H01L 21/76283 |
| 2017/0365513 A1 * | 12/2017 | Yang | ................ | H01L 21/76876 |
| 2019/0157066 A1 * | 5/2019 | Zhou | .................. | H01L 21/7684 |
| 2019/0259860 A1 * | 8/2019 | Takino | ................ | H10D 84/038 |
| 2020/0044078 A1 * | 2/2020 | Yilmaz | ............. | H10D 30/0295 |
| 2020/0185225 A1 * | 6/2020 | Wang | ............. | H01L 21/76876 |
| 2021/0126124 A1 * | 4/2021 | Hsieh | .................. | H10D 62/107 |
| 2022/0384188 A1 * | 12/2022 | Venkatasubramanian | ................... |
| | | | | H01L 21/02175 |

* cited by examiner

<u>700</u>

900

FORM FEATURE ON SUBSTRATE     902

DEPOSIT FILM     904

ETCH FILM WITH PLASMA     906

DESIRED THICKNESS/FILM PROPERTIES OBTAINED?     912

NO

YES

POST-PROCESSING     914

APPARATUS FOR SINGLE CHAMBER DEPOSITION AND ETCH

CROSS-REFERENCE TO RELATED APPLICATIONS

This application claims priority to U.S. Provisional Application No. 63/208,490, filed Jun. 8, 2021, and U.S. Provisional Application No. 63/230,030, filed Aug. 5, 2021, the entire disclosures of which are hereby incorporated by reference herein.

TECHNICAL FIELD

Embodiments of the disclosure generally relate to methods for filling substrate features. More particularly, embodiments of the disclosure are directed to methods for filling a substrate feature with a single chamber deposition-etch scheme.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. One method that has had past success is flowable CVD. In this method, oligomers are carefully formed in the gas phase which condense on the surface and then "flow" into the trenches. The as-deposited film is of very poor quality and requires processing steps such as steam anneals and UV-cures.

As the dimensions of the structures decrease and the aspect ratios increase gapfilling processes are more likely to result in pinching-off of the film forming voids and seams. An approach that has been used to enable wider process windows for gapfill uses one or more cycles of deposition and etch followed by a final deposition. This process usually requires moving the wafer from a deposition chamber to an etch chamber causing increased processing time and costs, surface reactions such as oxidation when the wafers are removed from the chamber which changes the films, formation of interfaces of different film properties between deposition and etch steps.

Performing a deposition-etch process in a single chamber presents a number of challenges. Etch chemistries remove in-situ coatings from the deposition chambers and can result in metal contamination, defects, process drift and destruction of chamber components.

Accordingly, there is a need in the art for apparatus and methods for single-chamber gapfilling using a deposition-etch scheme.

SUMMARY

One or more embodiments of the disclosure are directed to processing methods comprising: depositing a first film on a substrate surface in a first processing station of a processing chamber, the substrate surface having at least one feature thereon, the at least one feature extending a feature depth from the substrate surface to a bottom surface, the at least one feature having a width defined by a first sidewall and a second sidewall, wherein the first film is deposited on the substrate surface, the first sidewall, the second sidewall, and the bottom surface of the at least one feature, the first film forming conformally on the substrate surface; and etching the first film in a second processing station of the processing chamber to non-conformally etch a portion of the first film from the substrate surface, the non-conformal etch removing more of the first film on the feature sidewall near the substrate surface than on a bottom of the feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
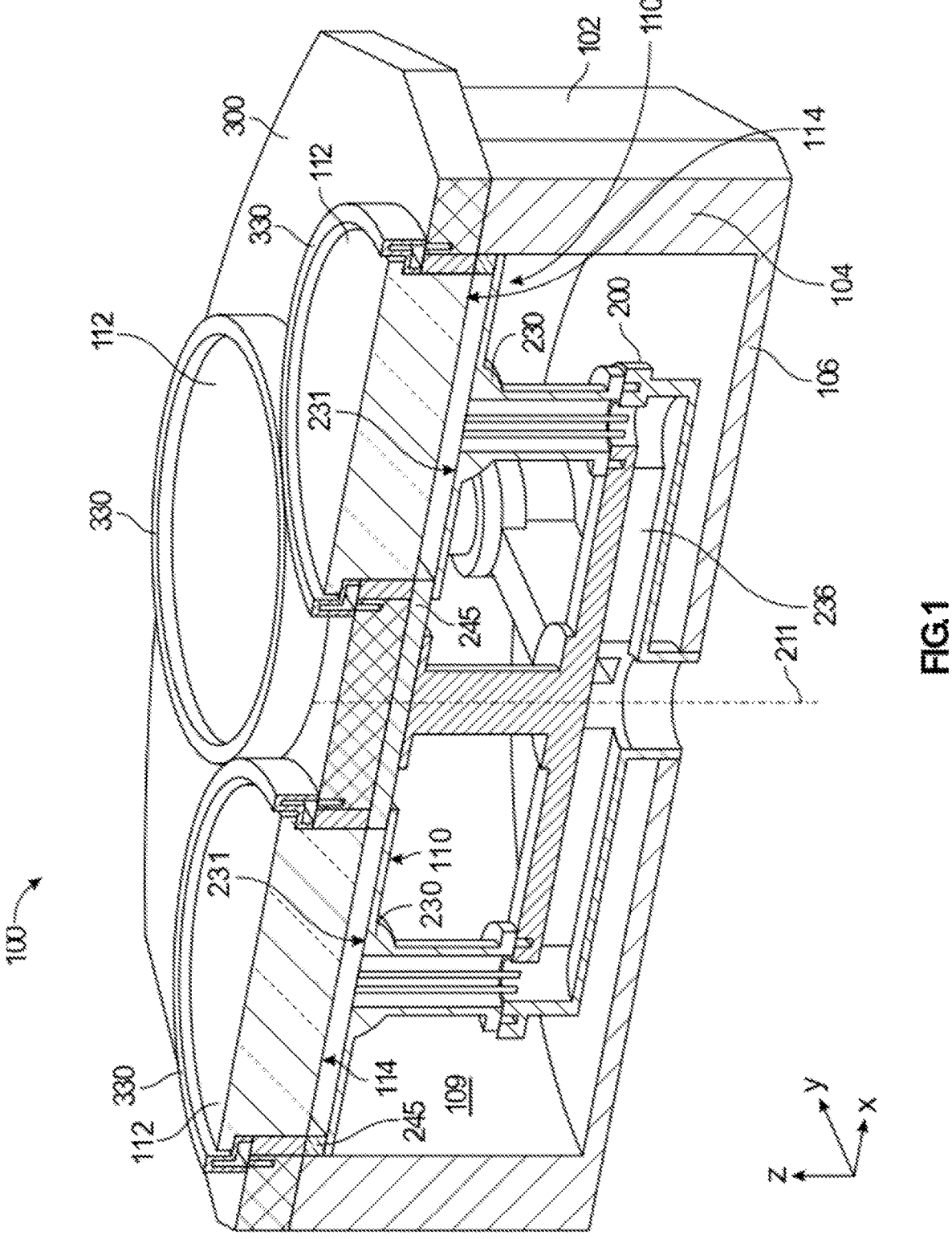
FIG. 1 shows a cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

Embodiments of the disclosure provide methods of depositing a metal nitride film (e.g., titanium nitride (TiN), or silicon nitride (SiN)) in high aspect ratio (AR) structures with small dimensions. One or more embodiments of the disclosure provide apparatus and methods that allow deposition and etch processes to be run in a single processing chamber. Some embodiments use a resonant cavity microwave plasma source with a monolithic alumina showerhead which has an array of resonant cavity plasma sources integrated with the gas distribution system between them. In one or more embodiments, deposition and etch processes can be run on the same chamber with the same recipe for gapfill applications.

Some embodiments of the disclosure advantageously integrate deposition and etch processes into a single chamber with little or no interface formed between cycles. Some embodiments advantageously provide time and cost savings over transferring a wafer to another chamber or cool. Some embodiments make it feasible to perform many deposition and etch cycles enabling a wider process window.

Figure 2:
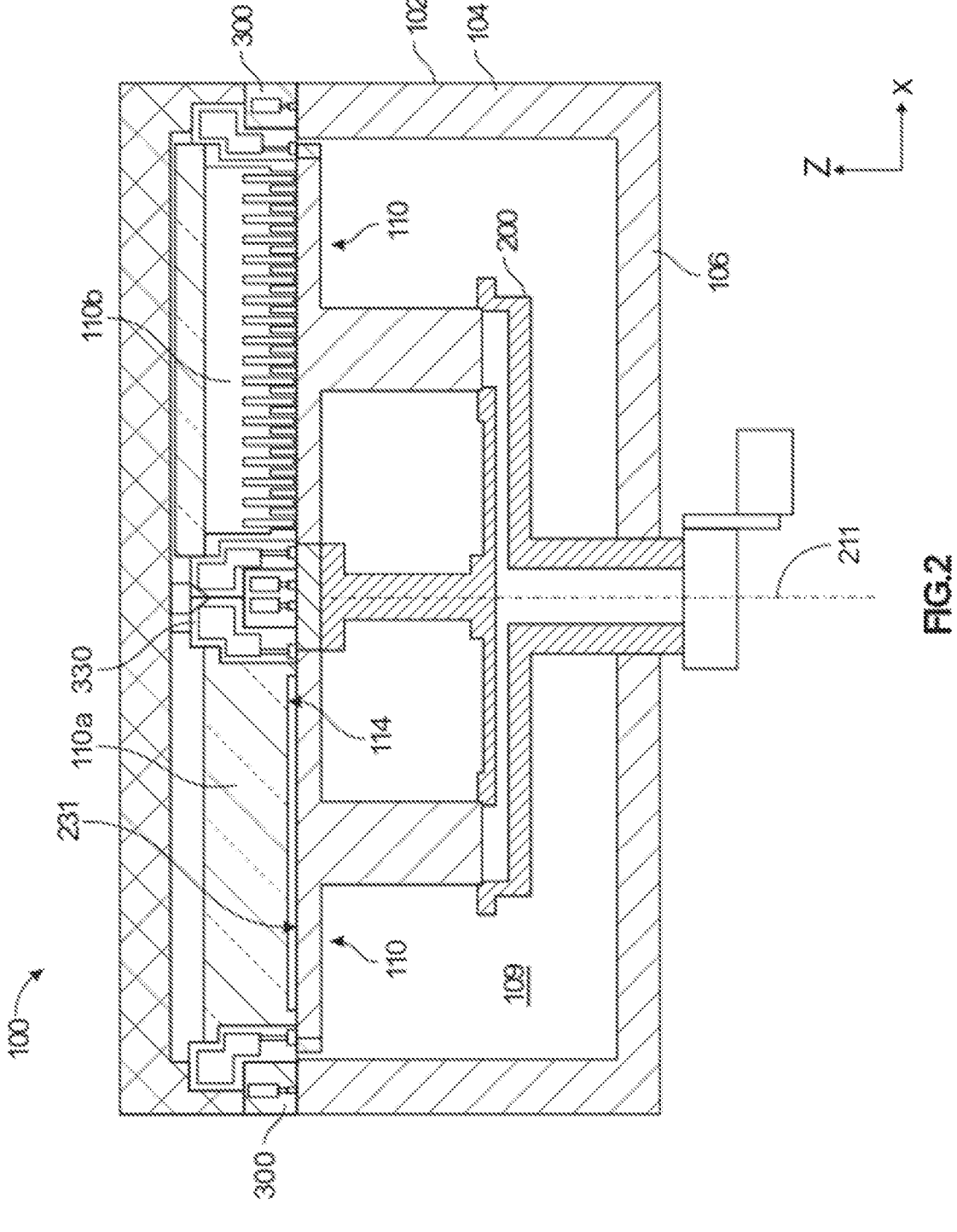
FIG. 2 shows a cross-sectional view of a processing chamber in accordance with one or more embodiment of the disclosure.

The disclosure provides methods for use with single wafer or multi-wafer (also referred to as batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200.

The processing chamber 100 has a housing 102 with walls 104 and a bottom 106. The housing 102 along with the top plate 300 define a processing volume 109, also referred to as an interior volume.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas injectors 112. In the illustrated embodiment, heaters 230 act as the substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
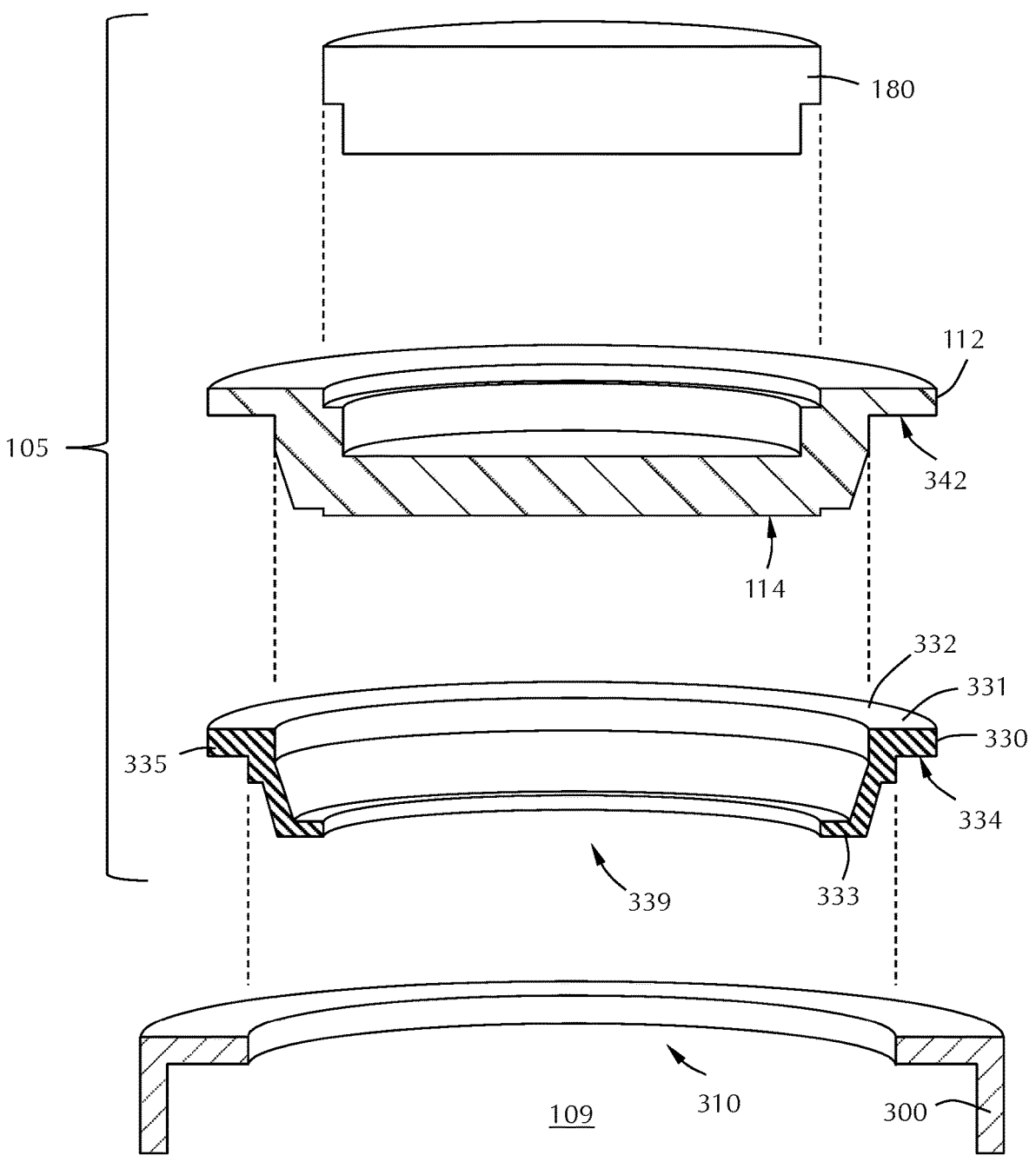
FIG. 3 is an exploded cross-sectional view of a processing station in accordance with one or more embodiment of the disclosure.

FIG. 3 illustrates an exploded view of a gas distribution assembly 105 for use in a processing station 110 or a process chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert. In some embodiments, the spacer 330 is connected to or in fluid communication with a vacuum (exhaust). In some embodiments, the spacer 330 is connected to or in fluid communication with a purge gas source.

The openings 310 in the top plate 300 can be uniformly sized or have different sizes. Different sized/shape gas injectors 112 can be used with a pump/purge spacer 330 that is suitably shaped to transition from the opening 310 to the gas distribution plate 112. For example, as illustrated, the pump/purge spacer 330 includes a top 331 and bottom 333 with a sidewall 335. When inserted into the opening 310 in the top plate 300, a ledge 334 is configured to be positioned in the opening 310.

The pump/purge spacer 330 includes an opening 339 in which a gas distribution plate 112 can be inserted. The gas distribution plate 112 illustrated has a flange 342 which can be in contact with the ledge formed by the back surface 332 adjacent the top 331 of the pump/purge spacer 330. The diameter or width of the gas distribution plate 112 can be any suitable size that can fit within the opening 339 of the pump/purge spacer 330. This allows gas injectors 112 of various types to be used within the same opening 310 in the top plate 300.

Figure 4:
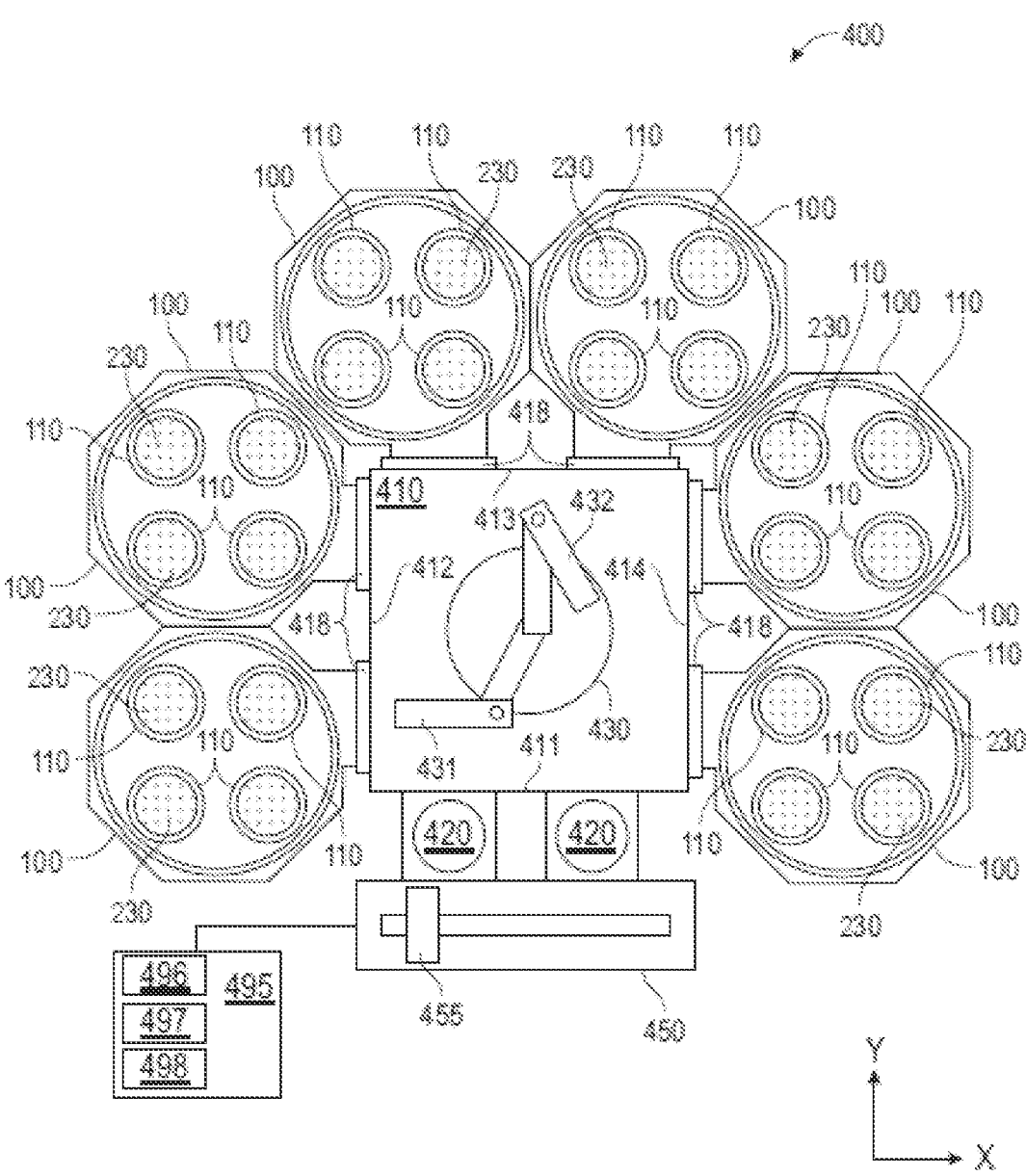
FIG. 4 is a schematic representation of a processing platform in accordance with one or more embodiment of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different number of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

Figures 5, 6:
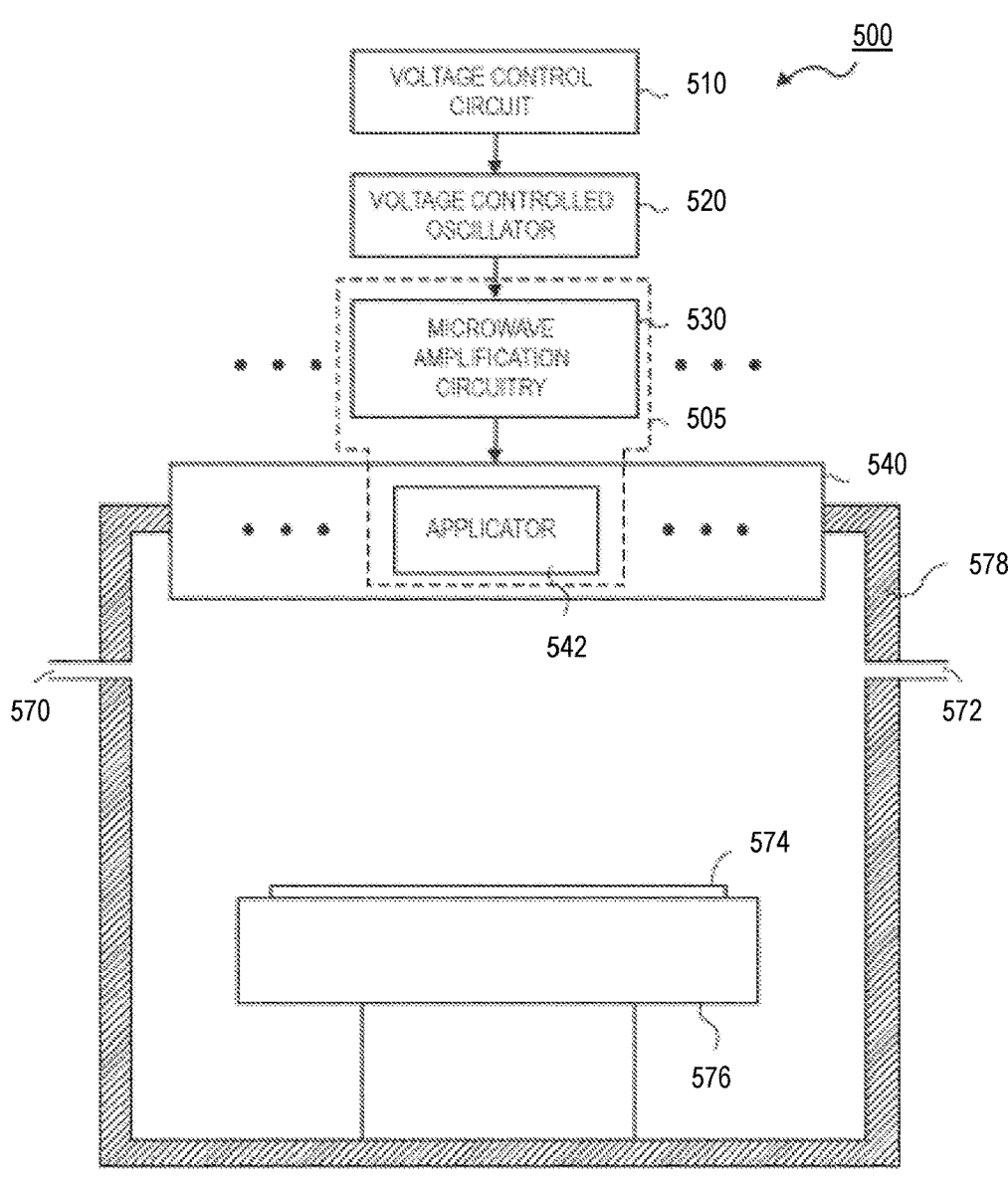
FIG. 5 illustrates a cross-sectional view of a source that may be used to couple microwave radiation to a processing chamber according to one or more embodiment of the disclosure.
FIG. 6 illustrates a schematic diagram of a plasma processing tool that includes a microwave plasma source according to one or more embodiment of the disclosure.

One or more embodiments of the disclosure achieve both deposition and etch using a μwave source 505. In some embodiments, as illustrated in FIG. 5, the μwave source 505 comprises an array of resonant cavities 553 each having its own μwave power supply. In some embodiments, a monolithic plate 554 connects the resonant cavities 553. In some embodiments, the monolithic plate 554 is ceramic plate. In some embodiments, the monolithic plate 554 is an alumina plate. A gas distribution system which delivers gas through holes 555 in the monolithic plate 554 between the resonant cavities 553. As used herein, the terms "holes" (e.g., holes 555) and "apertures" may be used interchangeably.

The issues with the chamber materials being attacked are minimized due to the low ion energy nature of the μwave plasma and the monolithic plate being made from alumina. In some embodiments, there is no measurable etch rate for alumina in the μwave NF₃ plasma while the same plasma still has significant etch rate for films such as SiN or TiN. In some embodiments, metal contamination is also addressed by using high purity alumina or coating the alumina plate with ALD $Al_2O_3$ which has almost no metal impurity besides Al.

Referring to FIG. 6, a cross-sectional illustration of an exemplary μwave processing tool 500 is shown. The processing tool 500 may be any processing tool suitable for any type of processing operation that utilizes a plasma. While the embodiments described in detail herein are directed to ALD plasma processing methods, it is to be appreciated that additional plasma processing methods may also be practiced on processing tool 500. Further, it is also to be appreciated that the PEALD methods described herein may also be performed using differing processing tools.

Generally, the processing tool 500 includes a chamber 578. In processing tools 500 that are used for plasma processing, the chamber 578 may be a vacuum chamber. A vacuum chamber may include a pump (not shown) for removing gases from the chamber to provide an operative pressure. Additional embodiments may include a chamber 578 that includes one or more gas lines 570 for providing processing gasses into the chamber 578 and exhaust lines 572 for removing byproducts from the chamber 578. While not shown, it is to be appreciated that the processing tool may include a showerhead or other gas distribution assembly for evenly distributing the processing gases over a substrate 574. In some embodiments, the processing tool 500 is a processing station 110 in processing chamber 100 (see FIG. 1).

In some embodiments, the substrate 574 may be supported on a chuck 576. For example, the chuck 576 may be any suitable chuck, such as an electrostatic chuck. The chuck may also include cooling lines and/or a heater to provide temperature control to the substrate 574 during processing. In some embodiments, the substrate 574 is positioned on movable heaters 230, as shown in FIG. 1.

The processing tool 500 includes one or more microwave sources 505. The microwave source 505 may include solid state microwave amplification circuitry 530 and one or more source (also referred to as an applicator 542). In some embodiments, a voltage control circuit 510 provides an input voltage to a voltage-controlled oscillator 520 in order to produce microwave radiation at a frequency that is transmitted to the solid state microwave amplification circuitry 530 in each microwave source 505. After processing by the microwave amplification circuitry 530, the microwave radiation is transmitted to the source 542. In some embodiments, an array 540 of sources (applicators 542) are coupled to the chamber 578 and each function as an antenna for coupling the microwave radiation to the processing gasses in the chamber 578 to produce a plasma.

Some embodiments of the disclosure advantageously provide processing chambers that allow plasma-enhanced atomic layer deposition (PEALD) of a thin film as well as the plasma etch of that film. There are substantial engineering challenges to build a plasma source that can be used for both deposition and etch. For example, maintaining stable plasma, material compatibility, defects and metal contamination.

In some embodiments, the plasma-enhanced atomic layer deposition method comprises sequentially exposing the substrate surface to a thermal metal-containing precursor in the first process station and a plasma in the second process station. In some embodiments, the metal-containing precursor comprises one or more of silicon or titanium. In some embodiments, the plasma is generated by a μwave source. In some embodiments, the plasma comprises a mixture of argon, nitrogen and ammonia.

Figure 7:
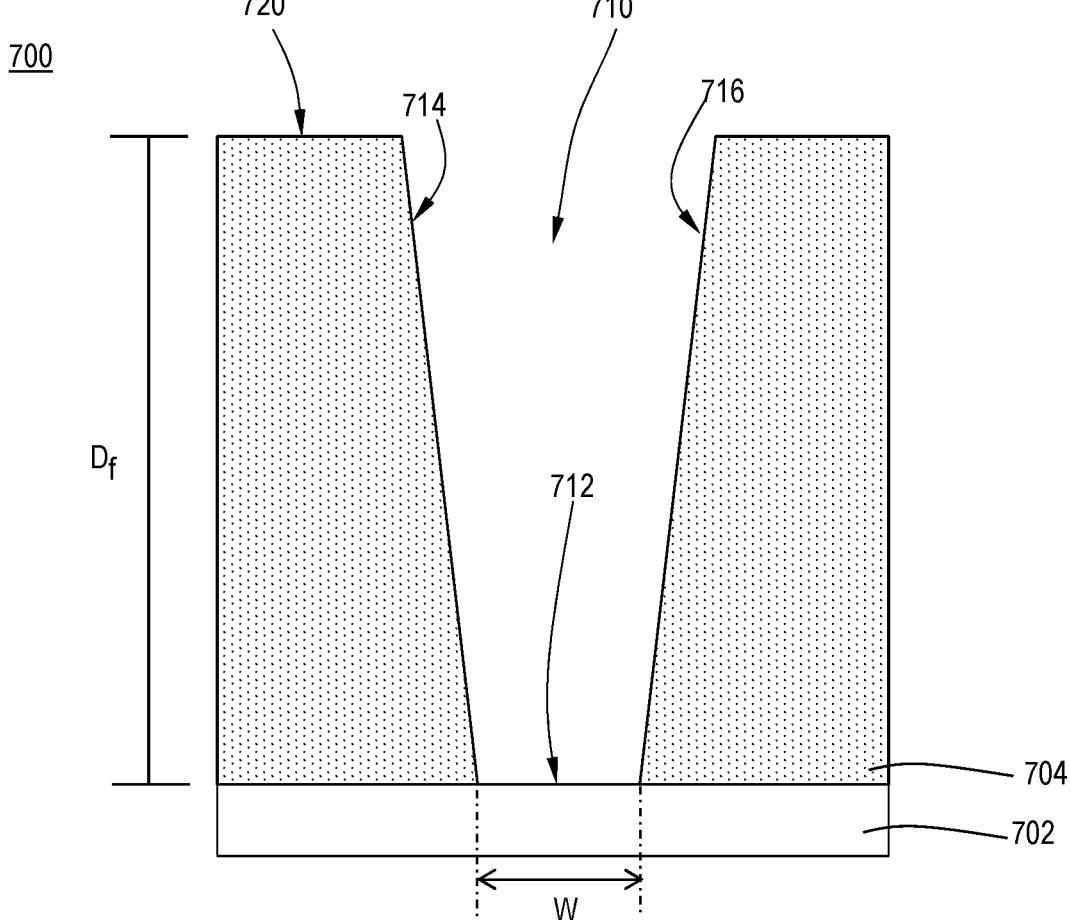
FIG. 7 shows a cross-sectional view of a substrate feature in accordance with one or more embodiment of the disclosure.

FIG. 7 shows a partial cross-sectional view of a substrate 700 with a feature 710. The Figures show a substrate 700 having a single feature 710 for illustrative purposes; however, those skilled in the art will understand that there can be more than one feature. The shape of the feature 710 can be any suitable shape including, but not limited to, trenches and cylindrical vias. As used in this regard, the term "feature" means any intentional surface irregularity. Suitable examples of features include, but are not limited, to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 700 has a substrate surface 720. The at least one feature 710 forms an opening in the substrate surface 720. The at least one feature 710 extends from the substrate surface 720 to a feature depth Df to a bottom surface 712. The at least one feature 710 has a first sidewall 714 and a second sidewall 716 that define a width W of the at least one feature 710. The skilled artisan will recognize that a cylindrical shaped via has one continuous sidewall and that the use of first sidewall 714 and second sidewall 716 are relative to the cross-sectional view illustrated. The open area formed by the sidewalls 714, 716 and bottom 712 are also referred to as a gap. In one or more embodiments, the width W is homogenous along the depth Df of the at least one feature 710. In other embodiments, the width, W, is greater at the top of the at least one feature 710 than the width, W, at the bottom surface 712 of the at least one feature 710, as shown in FIG. 7.

Figure 8A:
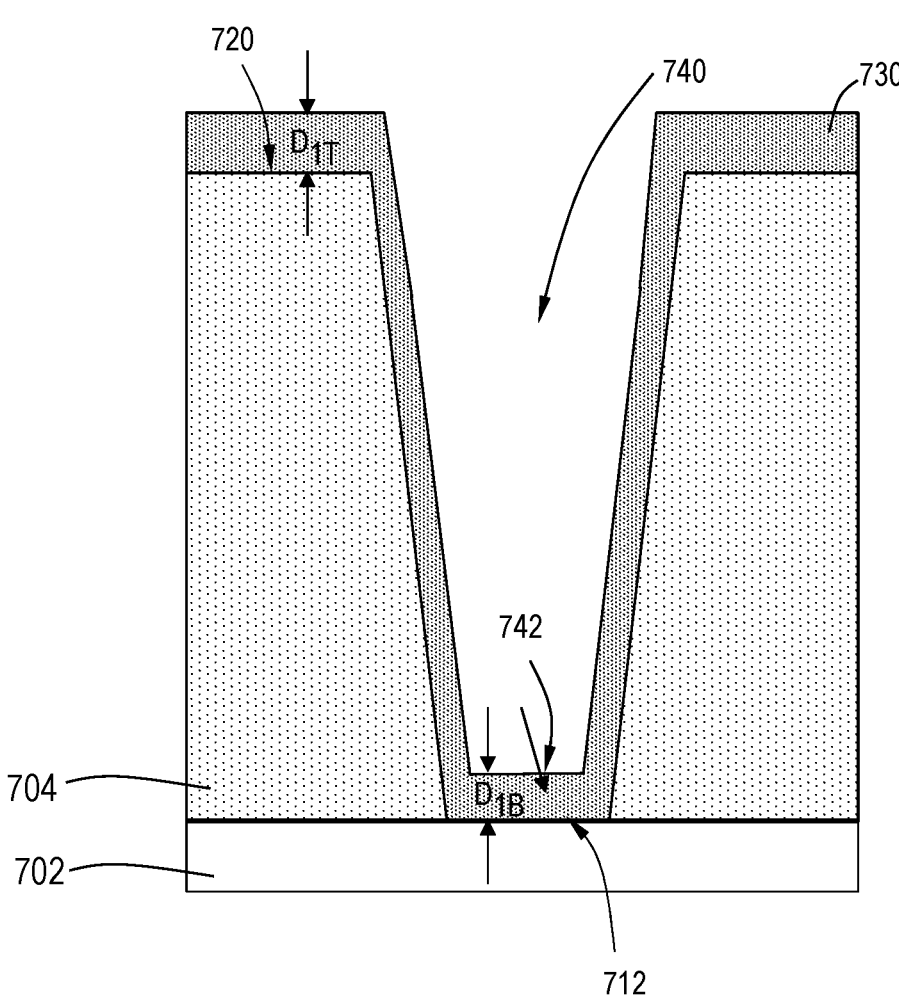
FIGS. 8A-8B shows a cross-sectional view of a substrate feature during a gapfilling process in accordance with one or more embodiment of the disclosure.
Figure 8B:
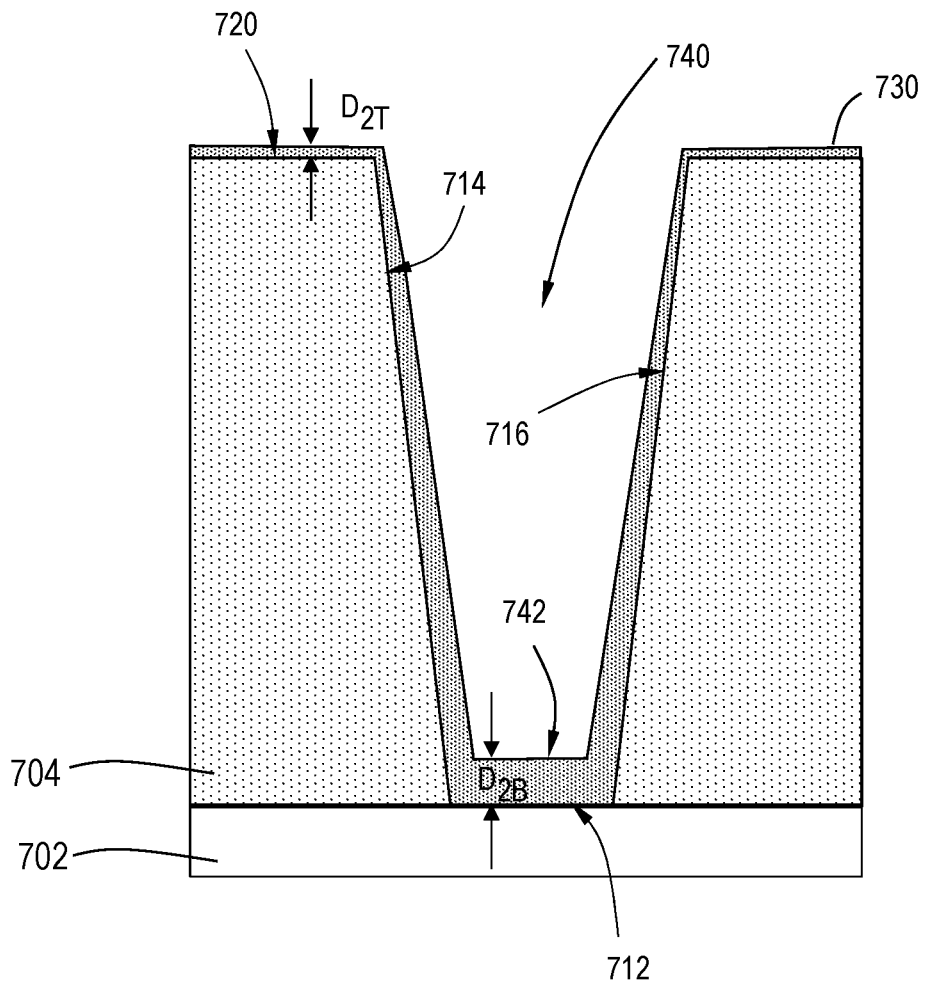
Figure 9:
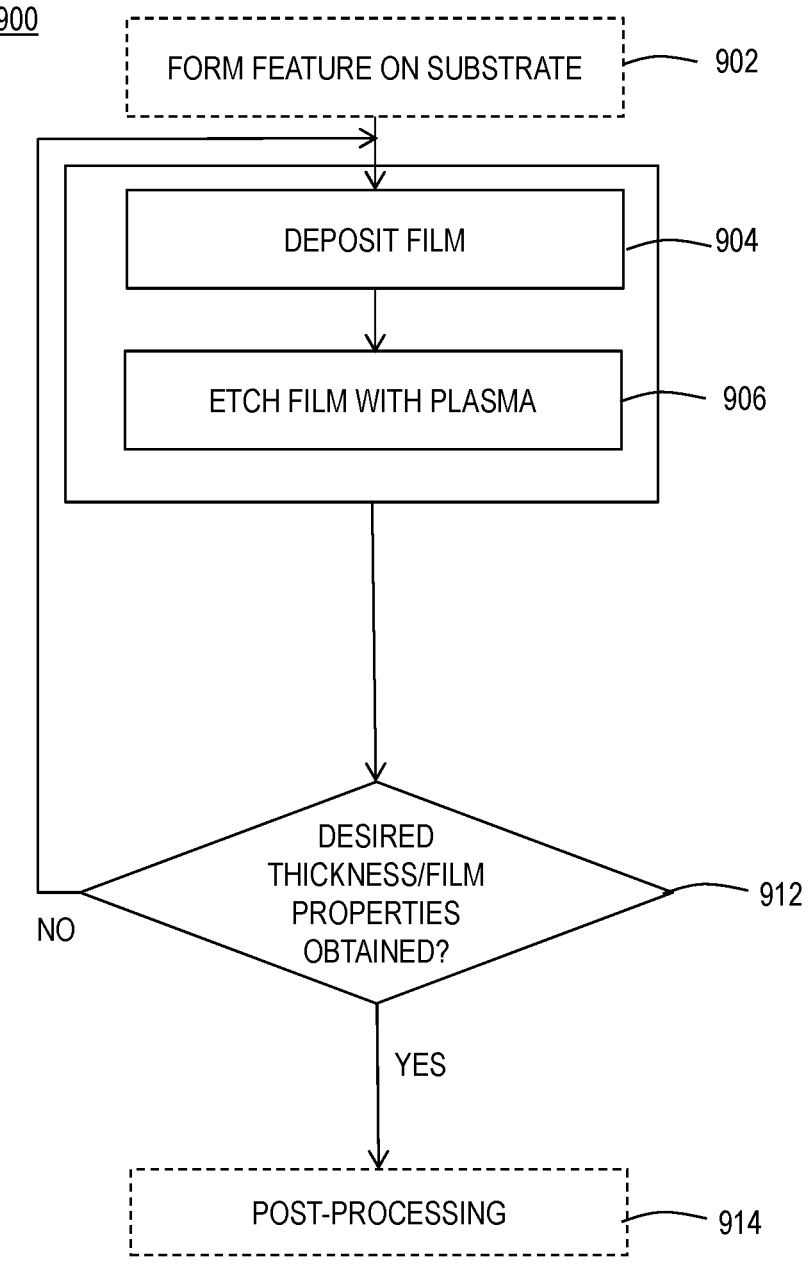
FIG. 9 shows a process flow in accordance with one or more embodiment of the disclosure.

FIGS. 8A through 8B show a cross-sectional schematic of a gapfill process in accordance with one or more embodiment of the disclosure. FIG. 9 shows a processing method 900 in accordance with one or more embodiments of the disclosure. With reference to FIGS. 8A, 8B and FIG. 9, in one or more embodiments, at least one feature 710 is formed on a substrate 700 at operation 902. In some embodiments, the substrate 700 is provided for processing prior to operation 902. As used in this regard, the term "provided" means that the substrate is placed into a position or environment for further processing. In one or more embodiments, the substrate 700 has at least one feature 710 already formed thereon.

In one or more embodiments, at operation 904, a first film 730 is formed on the substrate surface 720 and the walls 714, 716 and the bottom of the at least one feature 710. As illustrated in FIG. 8A, in one or more embodiments, the first film has an opening 740 located within the width, W, of the at least one feature 710 at a first distance, Di, from the bottom surface of the at least one feature 710.

In one or more embodiments, the first film 730 can be comprised of any suitable material. In some embodiments, the first film 730 comprises one or more of silicon nitride (SiN) or titanium nitride (TiN). In one or more embodiments, the first film is formed by atomic layer deposition or plasma-enhanced atomic layer deposition.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., manganese precursor, ruthenium precursor, or a manganese-ruthenium precursor) is pulsed into the reaction zone followed by a first time delay. Next, a second precursor or compound B (e.g., reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The precursor-containing process gas may be provided in one or more pulses or continuously. The flow rate of the precursor-containing process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The precursor can be provided at any suitable pressure including, but not limited to, a pressure in the range of about 5 mTorr to about 500 Torr, or in the range of about 100 mTorr to about 500 Torr, or in the range of about 5 Torr to about 500 Torr, or in the range of about 50 mTorr to about 500 Torr, or in the range of about 100 mTorr to about 500 Torr, or in the range of about 200 mTorr to about 500 Torr.

The period of time that the substrate is exposed to the one or more precursor-containing process gas may be any suitable amount of time necessary to allow the precursor to form an adequate nucleation layer atop the conductive surface of the bottom of the opening. For example, the process gas may be flowed into the process chamber for a period of about 0.1 seconds to about 90 seconds. In some time-domain ALD processes, the precursor-containing process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert carrier gas may additionally be provided to the process chamber at the same time as the precursor-containing process gas. The carrier gas may be mixed with the precursor-containing process gas (e.g., as a diluent gas) or separately and can be pulsed or of a constant flow. In some embodiments, the carrier gas is flowed into the processing chamber at a constant flow in the range of about 1 to about 10000 sccm. The carrier gas may be any inert gas, for example, such as argon, helium, neon, combinations thereof, or the like. In one or more embodiments, a precursor-containing process gas is mixed with argon prior to flowing into the process chamber.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Suitable silicon precursors include, but are not limited to, silane, disilane, dichlorosilane (DCS), trisilane, tetrasilane, etc. In one or more embodiments, the precursor may be heated in a hot can to increase the vapor pressure and be delivered to the chamber using a carrier gas (e.g., ultrahigh purity (UHP) Ar, He, H$_2$, etc.).

In some embodiments, the first film 730 forms conformally on the at least one feature 710. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the first film 730 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

With reference to FIG. 8A, in one or more embodiments, an opening 740 is formed within the width, W, of the at least one feature 710. In one or more embodiments, when the first film 730 is deposited, a first seam 745 is formed in first film 730. In one or more embodiments, the first seam 745 has a first seam length. The shape and size of the void 740 can vary. In one or more embodiments, the void 740 has a bottom edge 742 that is a first distance $D_{1B}$ from the bottom surface 712 of the at least one feature 710. The thickness $D_{1T}$ of the first film 730 deposited on the substrate surface 720 is in the range of 90-110% of the thickness at the bottom surface 712 (distance $D_{1B}$).

The first film 730 is deposited in a first process station within the processing chamber (see FIG. 1). After operation 904 deposits the first film 730, the process moves to operation 906 in which a portion of the first film 730 is etched in a second process station of the processing chamber.

In some embodiments, etching the first film 730 occurs non-conformally. Referring to FIG. 8B, the non-conformal etch process removes more of the first film 730 on the feature sidewall 714, 716 near the substrate surface 720 than on the bottom 712 of the feature 710. In some embodiments, the non-conformal etch process decreases the thickness $D_{2T}$ on the substrate surface 720 by an amount greater than or equal to 50%, 40%, 30%, 20% or 10% of the pre-etch thickness $D_{1T}$. In some embodiments, the non-conformal etch process decreases the thickness of the first film 730 at the bottom of the feature so that the second distance $D_{2B}$ from the bottom surface 712 of the at least one feature 710 is greater than or equal to 50%, 60%, 70%, 80% or 90% of the pre-etch thickness (distance $D_{1B}$). In some embodiments, etching the first film 730 leaves at least 10 Å of the first film 730 in the bottom of the feature 710. In some embodiments, etching the first film 730 leaves less than or equal to 5 Å, including less than or equal to 4 Å, less than or equal to 3 Å, less than or equal to 2 Å, or less than or equal to 1 Å of the first film 730 on the substrate surface 720.

In some embodiments, etching the first film 730 comprises exposing the first film to an etchant. The etchant of some embodiments comprises one or more of $NF_3$, $SF_6$, $CF_4$, $CHF_3$, $C_4F_8$ or $Cl_2$.

After non-conformal etching at operation 906, decision point 912 is evaluated. If the film deposited in the feature has filled the feature to a predetermined level, the method 900 moves to an optional post-processing 914. If the predetermined amount has not been deposited, the method 900 repeats operation 904 and operation 906 until the feature is full.

In some embodiments, operation 906 is omitted as the last operation prior to decision point 912. The non-conformal etch process in some embodiments is omitted near the end of the gapfilling method once the risk of seam or void formation has been eliminated or minimized.

According to one or more embodiments, the substrate is subjected to processing prior to and/or after forming the layer. This processing can be performed in the same chamber or in one or more separate processing chambers.

In some embodiments, deposition 904 and etch 906 processes occur in a multi-station process chamber. In an exemplary embodiment, a multi-station process chamber comprises four stations arranged as alternating first stations and second stations, so that there are two first stations and two second stations.

In some embodiments, the first stations are configured for thermal deposition, e.g., to expose a substrate to one or more process gas without plasma. The thermal deposition can be either a first reaction of a binary, or higher order, deposition process (e.g., a first exposure of a two exposure, or more, process) or a thermal decomposition resulting in a film.

In some embodiments, the second stations are configured for plasma processing, as discussed above. The second stations of some embodiments are used in a second step of a binary (or higher order) deposition process, or as a plasma treatment of a film formed by thermal decomposition in the first process station.

In one or more embodiments, the second stations are also configured to plasma etch the film deposited by the first/second station combination. Stated differently, in some embodiments, deposition 904 occurs in a two-step reaction where the first step occurs in the first station and the second step occurs in the second station and etch 906 occurs in the second station so that the second station is used for both deposition and etch processes.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
    depositing a first film on a substrate surface in a first processing station of a processing chamber, the substrate surface having at least one feature thereon, the at least one feature extending a feature depth from the substrate surface to a bottom surface, the at least one feature having a width defined by a first sidewall and a second sidewall, wherein the first film is deposited on the substrate surface, the first sidewall, the second sidewall, and the bottom surface of the at least one feature, the first film forming conformally on the substrate surface; and
    etching the first film in a second processing station of the processing chamber to non-conformally etch a portion of the first film from the substrate surface, the non-conformal etch removing more of the first film on the first sidewall and the second sidewall near the substrate surface than on the bottom surface of the at least one feature, wherein depositing the first film comprises sequentially exposing the substrate surface to a thermal metal-containing precursor in the first processing station and a plasma in the second processing station, and etching the first film comprises exposing the first film to an etchant in the second processing station.

2. The processing method of claim 1, further comprising repeating depositing the first film and etching the first film until the at least one feature is full.

3. The processing method of claim 1, wherein the thermal metal-containing precursor comprises one or more of silicon or titanium.

4. The processing method of claim 3, wherein the plasma comprises a mixture of argon, nitrogen and ammonia.

5. The processing method of claim 1, wherein the plasma used to deposit the first film and the etchant used etch the first film are each independently generated by a microwave source.

6. The processing method of claim 5, wherein the microwave source comprises an alumina plate.

7. The processing method of claim 1, wherein the gas etchant comprises one or more of $NF_3$, $SF_6$, $CF_4$, $CHF_3$, $C_4F_8$, or $Cl_2$.

8. The processing method of claim 4, wherein the first film comprises one or more of silicon nitride or titanium nitride.

9. The processing method of claim 1, wherein etching the first film leaves at least 10 Å of the first film.

10. The processing method of claim 1, wherein the at least one feature has an aspect ratio greater than or equal to about 10:1.

11. A processing method comprising:

depositing a first film on a substrate surface in a first process station of a processing chamber, the substrate surface having at least one feature thereon, the at least one feature extending a feature depth from the substrate surface to a bottom surface, the at least one feature having a width defined by a first sidewall and a second sidewall, wherein the first film is deposited on the substrate surface, the first sidewall, the second sidewall, and the bottom surface of the at least one feature, the first film forming conformally on the substrate surface, the first sidewall, the second sidewall and the bottom surface;

etching the first film in a second process station of the processing chamber to non-conformally etch a portion of the first film from the substrate surface, the non-conformal etch removing more of the first film on the first sidewall and the second sidewall near the substrate surface than on the bottom surface of the at least one feature, wherein depositing the first film comprises sequentially exposing the substrate surface to a thermal metal-containing precursor in the first processing station and a plasma in the second processing station, and etching the first film comprises exposing the first film to an etchant in the second processing station; and repeating at least depositing the first film until the at least one feature is full.

12. The processing method of claim 11, wherein the thermal metal-containing precursor comprises one or more of silicon or titanium.

13. The processing method of claim 12, wherein the plasma comprises a mixture of argon, nitrogen and ammonia.

14. The processing method of claim 13, wherein the plasma used to deposit the first film and the etchant used to etch the first film are independently generated by a microwave source comprising an alumina plate.

15. The processing method of claim 11, wherein the etchant comprises one or more of $NF_3$, $SF_6$, $CF_4$, $CHF_3$, $C_4F_8$, or $Cl_2$.

* * * * *